(12) United States Patent
Ko et al.

(10) Patent No.: US 12,532,787 B2
(45) Date of Patent: Jan. 20, 2026

(54) SEMICONDUCTOR PACKAGE

(71) Applicant: Samsung Electronics Co., Ltd., Suwon-si (KR)

(72) Inventors: Jung Min Ko, Suwon-si (KR); Hyeon Jun Song, Suwon-si (KR); Hyeong Mun Kang, Suwon-si (KR); Tae Hyeong Kim, Suwon-si (KR); Young Woo Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 405 days.

(21) Appl. No.: 18/212,453

(22) Filed: Jun. 21, 2023

(65) Prior Publication Data

US 2024/0021581 A1 Jan. 18, 2024

(30) Foreign Application Priority Data

Jul. 18, 2022 (KR) .................. 10-2022-0088241

(51) Int. Cl.
*H01L 25/065* (2023.01)
*H01L 23/00* (2006.01)
(Continued)

(52) U.S. Cl.
CPC ...... *H01L 25/0657* (2013.01); *H01L 23/3107* (2013.01); *H01L 23/49822* (2013.01); *H01L 24/16* (2013.01); *H01L 24/32* (2013.01); *H01L 24/73* (2013.01); *H01L 24/81* (2013.01); H01L 2224/16148 (2013.01); H01L 2224/16227 (2013.01); H01L 2224/26145 (2013.01);
(Continued)

(58) Field of Classification Search
CPC ............ H01L 25/0657; H01L 23/3107; H01L 23/49822; H01L 24/16; H01L 24/32; H01L 24/73; H01L 24/81; H01L 2224/16148; H01L 2224/16227; H01L 2224/26145; H01L 2224/26175; H01L 2224/32059; H01L 2224/32145; H01L 2224/32225; H01L 2224/73204; H01L 2224/81203; H01L 2225/06513; H01L 2225/06517; H01L 2225/06541; H01L 2924/1431; H01L 2924/1432; H01L 2924/1436; H01L 2924/1437; H01L 2924/1441; H01L 23/49816; H01L 23/562; H01L 2225/06586; H01L 23/3128; H01L 21/563; H01L 24/13; H01L 24/29; H01L 24/83; H01L 24/92; H01L 24/31; H01L 25/18; H01L 2224/3318; H01L 2225/06527
See application file for complete search history.

(56) References Cited

U.S. PATENT DOCUMENTS 6,940,182 B2 * 9/2005 Hilton .................. H01L 21/563
257/E21.503
8,294,279 B2 10/2012 Chen et al.
(Continued)

*Primary Examiner* — Douglas W Owens
(74) *Attorney, Agent, or Firm* — Muir Patent Law, PLLC

(57) ABSTRACT

A semiconductor package comprises a base substrate, a first semiconductor chip on the base substrate, a first dam structure which overlaps a corner of the first semiconductor chip from a plan view and is placed on the base substrate and a first fillet layer which is placed vertically between the base substrate and the first semiconductor chip, and vertically between the first dam structure and the first semiconductor chip.

20 Claims, 20 Drawing Sheets

(51) Int. Cl.
*H01L 23/31* (2006.01)
*H01L 23/498* (2006.01)

(52) U.S. Cl.
CPC ............... *H01L 2224/26175* (2013.01); *H01L 2224/32059* (2013.01); *H01L 2224/32145* (2013.01); *H01L 2224/32225* (2013.01); *H01L 2224/73204* (2013.01); *H01L 2224/81203* (2013.01); *H01L 2225/06513* (2013.01); *H01L 2225/06517* (2013.01); *H01L 2225/06541* (2013.01); *H01L 2924/1431* (2013.01); *H01L 2924/1432* (2013.01); *H01L 2924/1436* (2013.01); *H01L 2924/1437* (2013.01); *H01L 2924/1441* (2013.01)

(56) References Cited

U.S. PATENT DOCUMENTS

| | | |
|---|---|---|
| 8,399,300 B2 | 3/2013 | Lee et al. |
| 9,502,341 B2 | 11/2016 | Song et al. |
| 10,553,558 B2 | 2/2020 | Katsura et al. |
| 11,062,968 B2 | 7/2021 | Chen et al. |
| 11,101,243 B2 * | 8/2021 | Park .................... H01L 25/0657 |
| 11,164,805 B2 | 11/2021 | Kim et al. |
| 11,289,454 B2 | 3/2022 | Kim |
| 12,176,313 B2 * | 12/2024 | Lee ......................... H01L 24/13 |
| 2023/0011778 A1 * | 1/2023 | Lee ....................... H01L 21/563 |

\* cited by examiner

SEMICONDUCTOR PACKAGE

CROSS-REFERENCE TO RELATED APPLICATION

This application claims priority to Korean Patent Application No. 10-2022-0088241 filed on Jul. 18, 2022 in the Korean Intellectual Property Office, the contents of which in its entirety are herein incorporated by reference.

BACKGROUND

1. Field of the Invention

The present disclosure relates to a semiconductor package.

2. Description of the Related Art

With the development of the electronic industry, there are increasing demands for high functionality, high speed, and miniaturization of electronic components. In response to this trend, a method of stacking and mounting a plurality of semiconductor chips on a single package wiring structure or stacking another package on the package may be used.

On the other hand, in semiconductor packaging, a non-conductive film (NCF) is often used between multiple semiconductor chips. With the miniaturization of the electronic components, solutions to issues such as warpage due to non-conductive films in the semiconductor packages are useful.

SUMMARY

Aspects of the present invention provide a semiconductor package having improved product reliability.

According to some aspects of the present inventive concept, a semiconductor package includes a base substrate, a first semiconductor chip on the base substrate, a first dam structure which overlaps a corner of the first semiconductor chip from a plan view, and is placed on the base substrate, and a first fillet layer which is placed vertically between the base substrate and the first semiconductor chip, and vertically between the first dam structure and the first semiconductor chip.

According to some aspects of the present inventive concept, which may be for the same embodiment as discussed above, a semiconductor package includes a base substrate, a first semiconductor chip on the base substrate, a first dam structure which overlaps a corner of the first semiconductor chip and is placed on the base substrate, and a first filling layer formed of a non-conductive material, placed vertically between the base substrate and the first semiconductor chip, and vertically between the first dam structure and the first semiconductor chip. The first filling layer protrudes outward from an outer surface of the first dam structure and a from side surface of the first semiconductor chip.

According to some aspects of the present inventive concept, which may be for the same embodiment as discussed above, a semiconductor package includes a base substrate, a first semiconductor chip on the base substrate, a first dam, which vertically overlaps a first corner of the first semiconductor chip, is disposed on the base substrate, and does not contact the first semiconductor chip, a first filling layer disposed vertically between the base substrate and the first semiconductor chip, and vertically between the first dam and the first semiconductor chip, a second semiconductor chip on the first semiconductor chip, a second filling layer filled vertically between the first semiconductor chip and the second semiconductor chip, and a molding member which covers the base substrate, the first semiconductor chip, the first filling layer, and the second semiconductor chip, wherein the molding member is not disposed between the base substrate and the first semiconductor chip.

However, aspects of the present invention are not restricted to the one set forth herein. The above and other aspects of the present invention will become more apparent to one of ordinary skill in the art to which the present invention pertains by referencing the detailed description of the present invention given below.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Hereinafter, embodiments according to the aspects of the present invention will be described with reference to the accompanying drawings.

Figure 1:
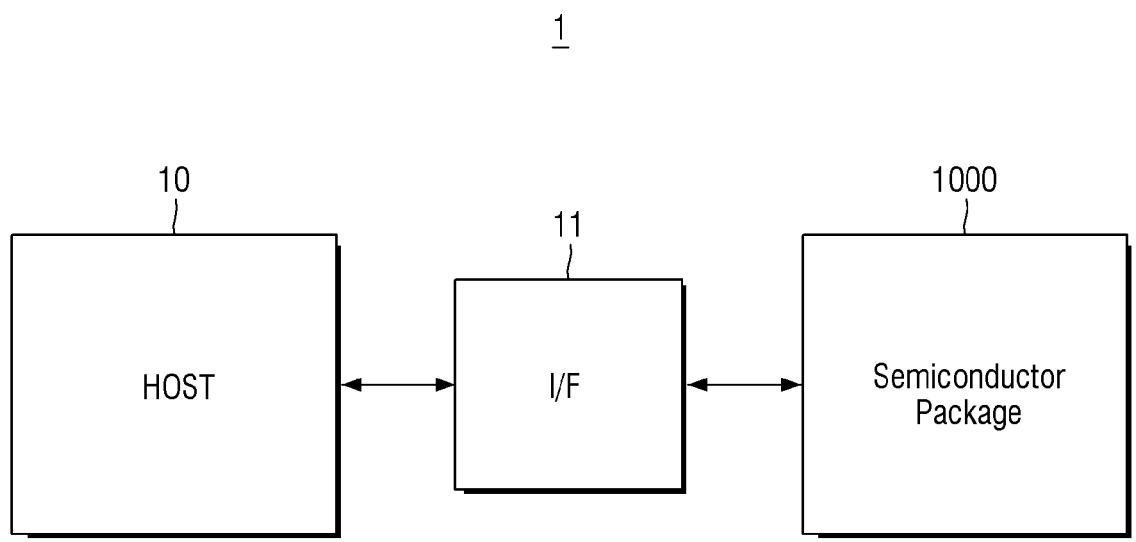
FIGS. 1 and 2 are diagrams for explaining an electronic device according to some embodiments.
Figure 2:
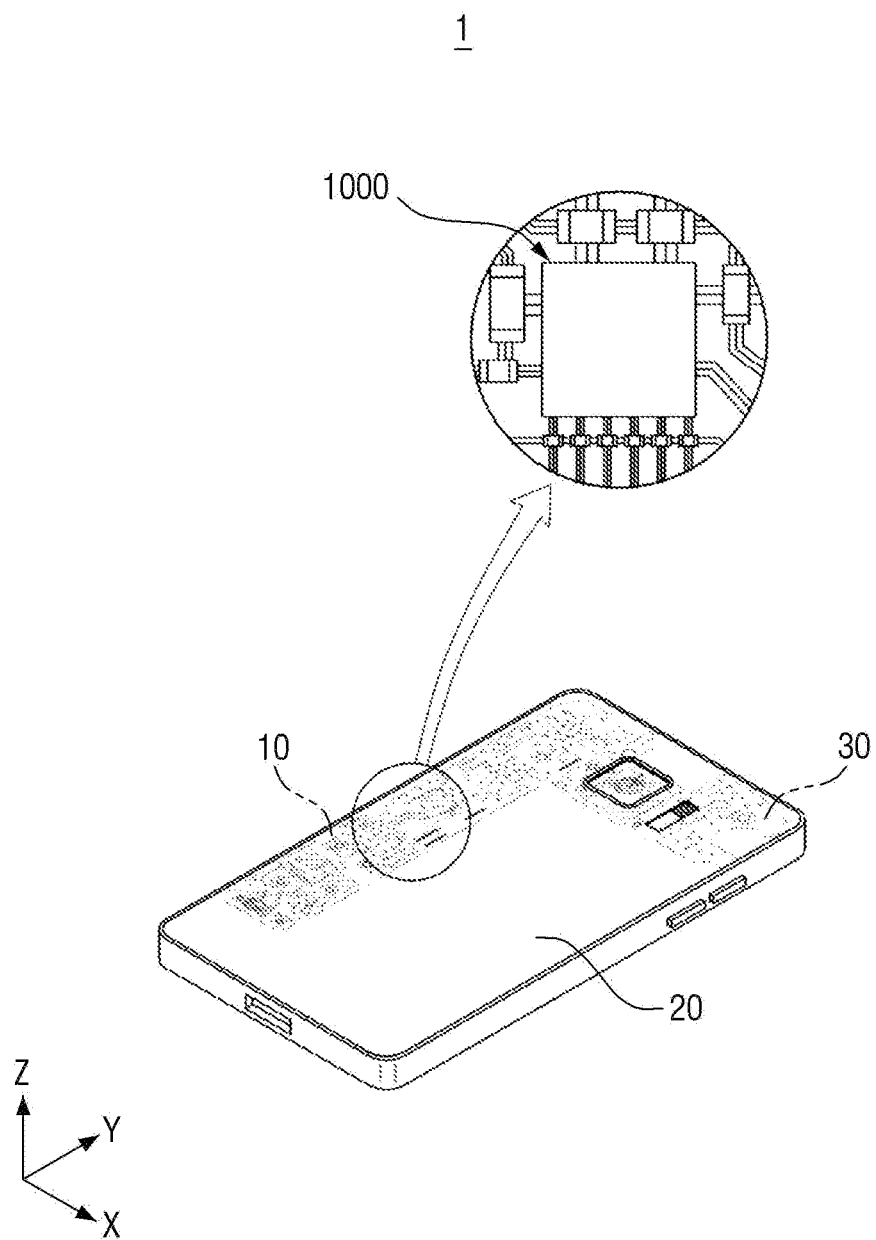
Figure 3:
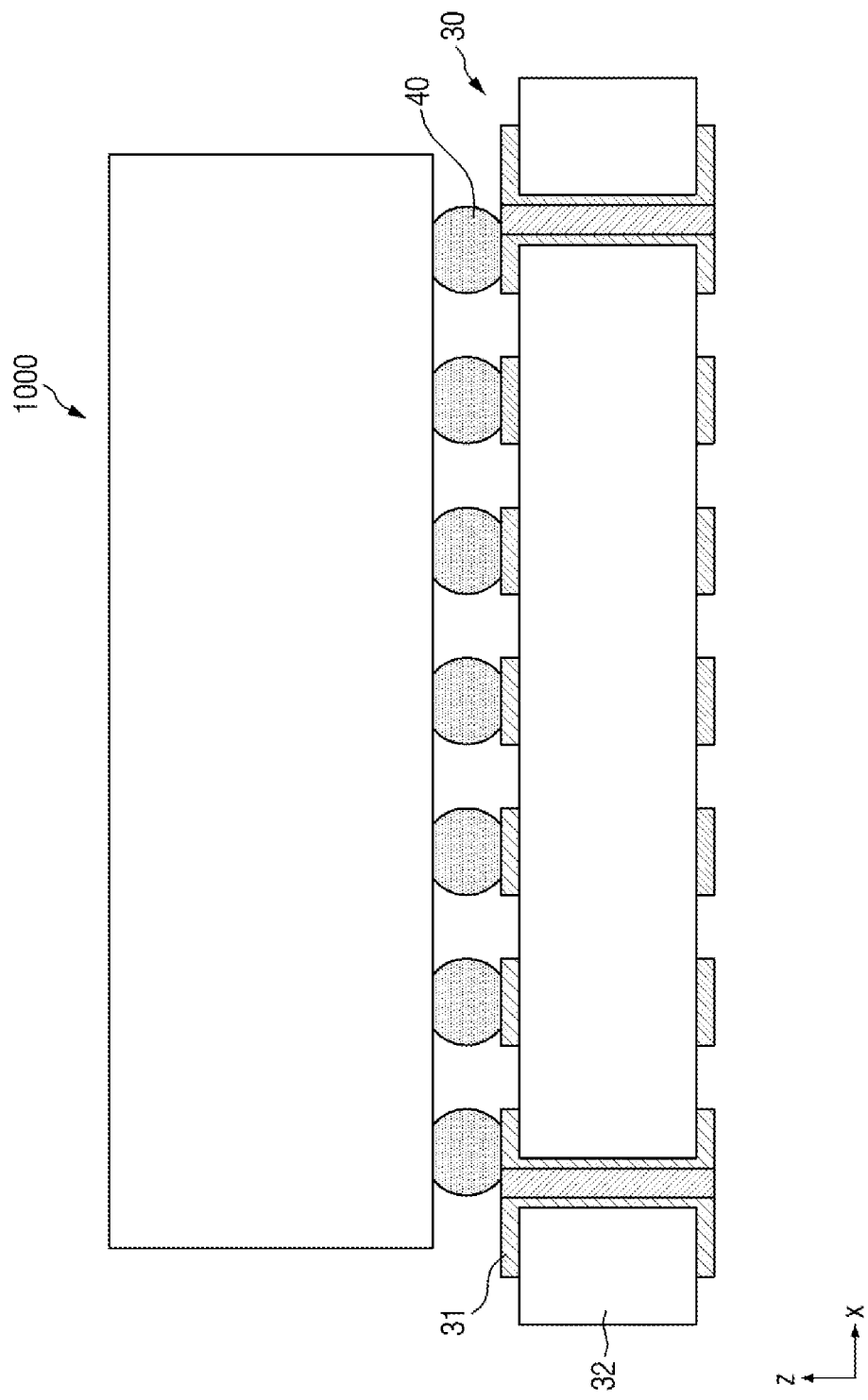
FIG. 3 is a diagram for explaining a semiconductor package and a main board of FIG. 2.
Figure 4:
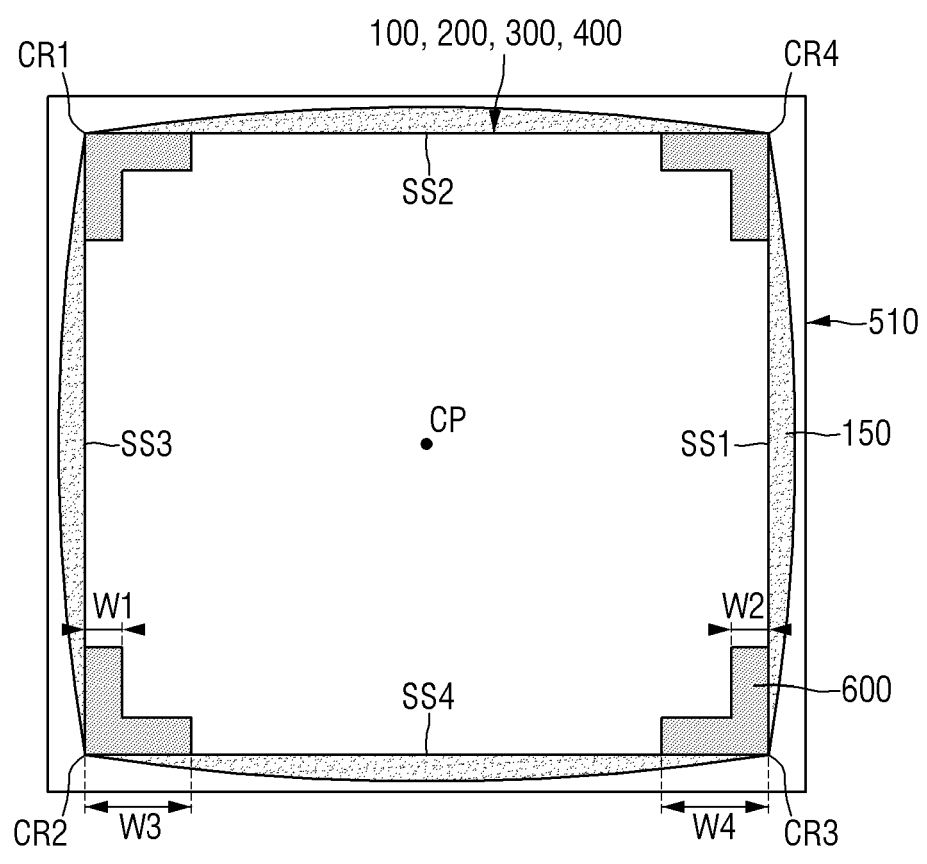
FIG. 4 is a layout diagram for explaining the semiconductor package according to some embodiments.
Figure 5:
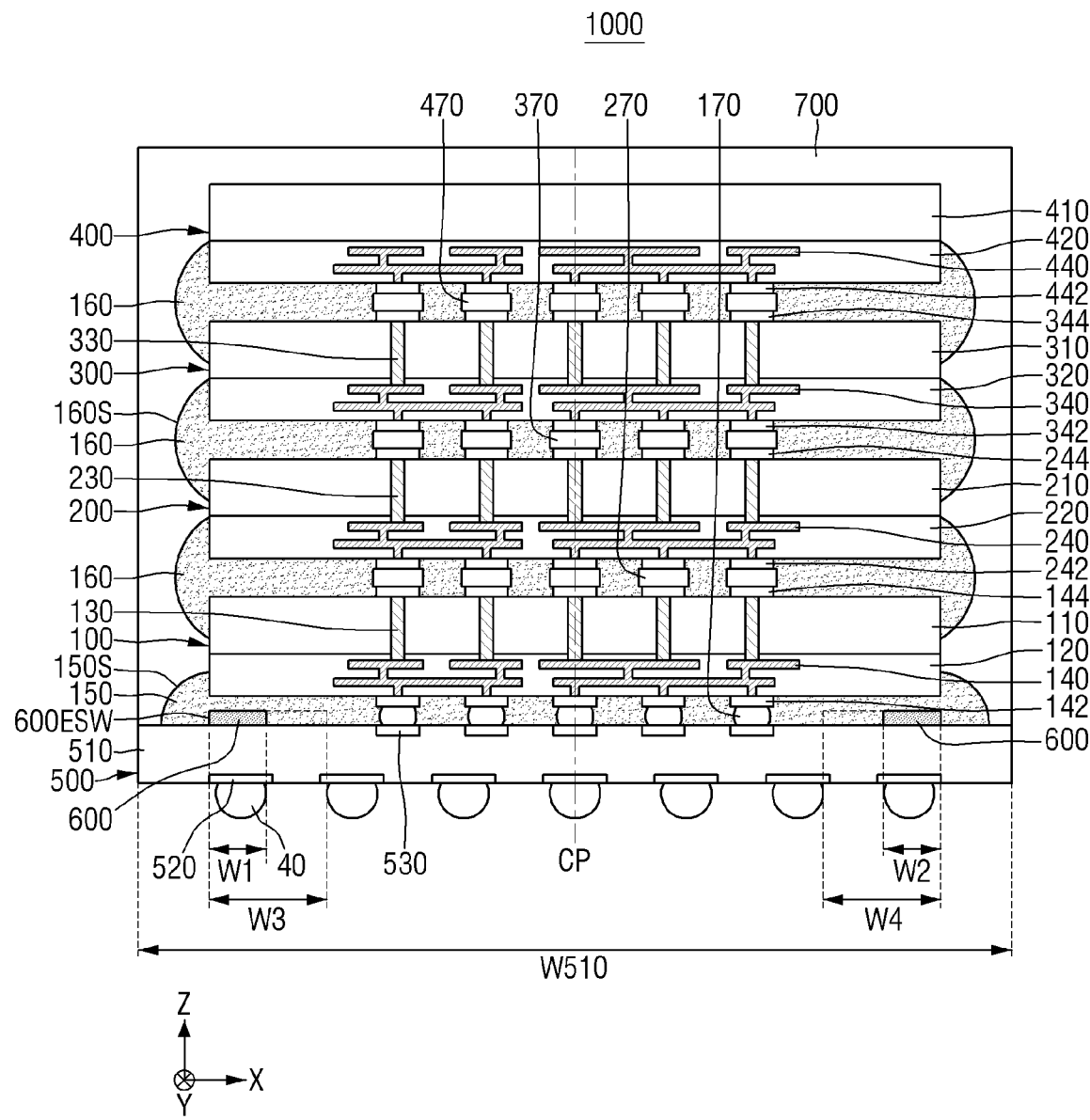
FIG. 5 is a cross-sectional view for explaining the semiconductor package according to some embodiments.

FIGS. 1 and 2 are diagrams for explaining an electronic device according to some embodiments. FIG. 3 is a diagram for explaining a semiconductor package and a main board of FIG. 2. FIG. 4 is a layout diagram for explaining the semiconductor package according to some embodiments. FIG. 5 is a cross-sectional view for explaining the semiconductor package according to some embodiments.

Referring to FIGS. 1 and 2, the electronic device 1 may include a host 10, an interface 11, a body 20, a main board 30, and a semiconductor package 1000.

In some embodiments, the host 10 may be connected to the semiconductor package 1000 through the interface 11. For example, the host 10 may deliver signals to the semiconductor package 1000 to control the semiconductor package 1000. Also, for example, the host 10 may receive signals from the semiconductor package 1000 and process data included in the signals.

For example, the host 10 may include a central processing unit (CPU), a controller, an application specific integrated circuit (ASIC), or the like. Further, for example, the host 10 may include a memory chip, such as a DRAM (Dynamic Random Access Memory), a SRAM (Static RAM), a PRAM (Phase-change RAM), a MRAM (Magneto resistive RAM), a FeRAM (Ferroelectric RAM) and a RRAM (Resistive RAM).

The main board 30 may be mounted inside the body 20 of the electronic device 1. The host 10 and the semiconductor package 1000 may be mounted on the main board 30. The host 10 and the semiconductor package 1000 may be electrically connected by the main board 30. For example, the interface 11, which may include various wiring patterns and other circuit components for communicatively connecting the host and the semiconductor package 1000, may be implemented by the main board 30.

The host 10 and the semiconductor package 1000 may be electrically connected by the main board 30 to transmit and receive signals.

Referring to FIG. 3, the semiconductor package 1000 may be placed on the main board 30. For example, an external connecting terminal 140 may be placed on the main board 30. The main board 30 may be connected to the semiconductor package 1000 by the external connecting terminal 140, which may be a conductive terminal, such as a ball or bump, for example.

The main board 30 may be a printed circuit wiring structure (printed circuit board: PCB), a ceramic wiring structure, a glass wiring structure, an interposer wiring structure, or the like. However, the embodiments of the present invention are not limited thereto. For convenience of explanation, the description will be provided on the assumption that the main board 30 is a printed circuit wiring structure.

The main board 30 may include a connecting structure 31 and a core 32. The core 32 may include or may be formed of a CCL (Copper Clad Laminate), a PPG, an ABF (Ajinomoto Build-up Film), epoxy, polyimide, and the like. The connecting structure 31 may include or be formed of, but is not limited to, at least one of copper (Cu), aluminum (Al), silver (Ag), tin (Sn), gold (Au), nickel (Ni), lead (Pb), titanium (Ti), and alloys thereof.

The core 32 is placed at a central part of the main board 30, and the connecting structure 31 may be placed above and below the core 32. The connecting structure 31 may be placed to be exposed above and below the main board 30.

Further, the connecting structure 31 may be placed to penetrate the core 32. The connecting structure 31 may electrically connect the elements that come into contact with the main board 30. For example, the connecting structure 31 may electrically connect the semiconductor package 1000 and the host 10. The connecting structure 31 may include wiring, such as pads, vias, and other conductive lines, that electrically connect the semiconductor package 1000 and the host 10 through the external connecting terminal 140.

Referring to FIGS. 4 and 5, the semiconductor package 1000 according to some embodiments may include first to fourth semiconductor chips 100 to 400, a base substrate 500, a dam structure 600, and a molding member 700.

The first to fourth semiconductor chips 100 to 400 may be logic chips or memory chips. All of the first to fourth semiconductor chips 100 to 400 may be memory chips of the same type. For example, the first to fourth semiconductor chips 100 to 400 may be volatile memory chips such as a DRAM (Dynamic Random Access Memory) and a SRAM (Static Random Access Memory). As another example, the first to fourth semiconductor chips 100 to 400 may be non-volatile memory chips such as a PRAM (Phase-change RAM), a MRAM (Magnetoresistive RAM), a FeRAM (Ferroelectric RAM) or a RRAM (Resistive RAM). As still another example, the first to fourth semiconductor chips 100 to 400 may be a HBM (High Bandwidth Memory).

Also, some of the first to fourth semiconductor chips 100 to 400 may be memory chips, and the other thereof may be logic chips. For example, some of the first to fourth semiconductor chips 100 to 400 may be microprocessors, analog devices, digital signal processors or application processors.

The first to fourth semiconductor chips 100 to 400 may include first to fourth corners CR1 to CR4 and first to fourth side surfaces SS1 to SS4. Each corner may include, for example, a corner edge where two side surfaces meet, and two corner points where two side surfaces and a top or bottom surface meet. However, this is an example, and the number of corners and the number of side surfaces may be varied according to the shapes of the first to fourth semiconductor chips 100 to 400. Hereinafter, the description will be provided on the assumption that the first semiconductor chip 100 includes the first to fourth corners CR1 to CR4 and the first to fourth side surfaces SS1 to SS4.

For example, the first semiconductor chip 100 may include first to fourth side surfaces SS1 to SS4. A first side surface SS1 may extend in a second direction Y. A second side surface SS2 may extend in a first direction X crossing the second direction Y, from one end (e.g., a first end) of the first side surface SS1. A third side surface SS3 may extend in the second direction Y from one end (e.g., a first end) of the second side surface SS2 and be opposite to, and parallel to, the first side surface SS1. A fourth side surface SS4 may extend in the first direction X from the other end (e.g., a second end) of the first side surface SS1 and be opposite to, and parallel to, the second side surface SS2. In some embodiments, the first to fourth side surfaces SS1 to SS4 may generally form a rectangle. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

The first corner CR1 may refer to a location at which the second side surface SS2 and the third side surface SS3 intersect. The first corner CR1 may include an edge formed by the second side surface SS2 and the third side surface SS3. A second corner CR2 may refer to a location at which the third side surface SS3 and the fourth side surface SS4 intersect. The second corner CR2 may include an edge formed by the third side surface SS3 and the fourth side surface SS4.

Similarly, a third corner CR3 may refer to a location at which the first side surface SS1 and the fourth side surface SS4 intersect. A fourth corner CR4 may refer to a location at which the first side surface SS1 and the second side surface SS2 intersect.

The first to fourth semiconductor chips 100 to 400 may be vertically stacked on the base substrate 500. In one embodiment, the first to fourth semiconductor chips 100 to 400 may have edges and side surfaces that overlap in the vertical direction (e.g., Z direction). The first to fourth semiconductor chips 100 to 400 may be electrically connected to each other through the first to fourth connection bumps 170, 270, 370 and 470 or may each be electrically connected directly to the base substrate 500.

The first to fourth semiconductor chips 100 to 400 and the base substrate 500 may be bonded together and/or adhered to each other with a non-conductive material, such as a non-conductive film (NCF). For example, a first fillet layer 150 may be placed between the first semiconductor chip 100 and the base substrate 500. The first fillet layer 150 may include or be formed of a non-conductive film. As another example, a second fillet layer 160 may be placed between the first semiconductor chip 100 and a second semiconductor chip 200. The second fillet layer 160 may be placed between the second semiconductor chip 200 and a third semiconductor chip 300, and between the third semiconductor chip 300 and a fourth semiconductor chip 400. Similarly, the second fillet layer 160 may include or be formed of a non-conductive film. The fillet layers described herein may also be described as filling layers, underfill layers, or adhesive layers, for example, which are formed of a non-conductive material.

Although four first to fourth semiconductor chips 100 to 400 are shown as being stacked in FIG. 5, the embodiments are not limited thereto. For example, the semiconductor package 1000 may include semiconductor chips stacked in other numbers, such as one or two, or more than four.

The first semiconductor chip 100 may include a first semiconductor substrate 110, a first semiconductor element layer 120, a first through-electrode 130, a first lower connection pad 142, a first upper connection pad 144, and a first connection bump 170. As can be seen from the figures, certain components will be described in the singular or using one instance as an example (e.g., a pad, or through-electrode), but a plurality of the components may be included in the device being described.

The first semiconductor substrate 110 may be, for example, bulk silicon or silicon-on-insulator (SOI). In another example, the first semiconductor substrate 110 may be a silicon substrate. As still another example, the first semiconductor substrate 110 may include or may be, but is not limited to, silicon germanium, silicon germanium on insulator (SGOI), indium antimonide, lead tellurium, indium arsenide, indium phosphide, gallium arsenide or gallium antimonide.

The first semiconductor substrate 110 may include a conductive region, for example, an impurity-doped well or an impurity-doped structure. The first semiconductor substrate 110 may have various device isolation structures such as a shallow trench isolation (STI) structure.

The first semiconductor element layer 120 may be placed on a lower surface of the first semiconductor substrate 110. The first semiconductor element layer 120 may include a plurality of individual elements of various types and an interlayer insulating film. The individual elements may include various microelectronic devices, for example, a MOSFET (metal-oxide-semiconductor field effect transistor) such as a CMOS transistor (complementary metal-insulator-semiconductor transistors), a system LSI (large scale integration), a flash memory, a DRAM, a SRAM, an EEPROM, a PRAM, a MRAM, a RRAM, an image sensor such as a CIS (CMOS Imaging Sensor), a MEMS (micro-electro-mechanical systems), an active device, a passive device, and the like.

The individual elements of the first semiconductor element layer 120 may be electrically connected to conductive regions formed in the first semiconductor substrate 110. The individual elements of the first semiconductor element layer 120 may be electrically separated from adjacent individual elements by insulating films. The first semiconductor element layer 120 may include a first wiring structure 140 that electrically connects at least two of the plurality of individual elements, or the plurality of individual elements and the conductive region of the first semiconductor substrate 110.

Although not shown, a lower passivation layer for protecting structures other than the first wiring structure 140 in the first semiconductor element layer 120 from external impact and moisture may be formed on the first semiconductor element layer 120. The lower passivation layer may expose a part of the upper surface of the first lower connection pad 142.

The first through-electrode 130 may penetrate through the first semiconductor substrate 110. The first through-electrode 130 may extend from the upper surface to the lower surface of the first semiconductor substrate 110. The first through-electrode 130 may be connected to a first wiring structure 140 provided inside the first semiconductor element layer 120.

The first through-electrode 130 may include or be formed of a barrier film formed on a pillar-shaped surface and a buried conductive layer that fills the inside of the barrier film. The barrier film may include or be formed of, but is not limited to, at least one of Ti, TiN, Ta, TaN, Ru, Co, Mn, WN, Ni, and NiB. The buried conductive layer may include or be formed of, but is not limited to, at least one of Cu alloys such as Cu, CuSn, CuMg, CuNi, CuZn, CuPd, CuAu, CuRe and CuW, W, W alloys, Ni, Ru and Co.

In some embodiments, an insulating film may be interposed between the first semiconductor substrate 110 and the first through-electrode 130. The insulating film may include or be, but is not limited to, oxide film, nitride film, carbide film, polymer or combinations thereof.

The first wiring structure 140 may include metal wiring layers and via plugs. For example, the first wiring structure 140 may be a multilayer structure in which two or more metal wiring layers or two or more via plugs are alternately stacked.

A first lower connection pad 142 may be placed on the first semiconductor element layer 120. The first lower connection pad 142 may be electrically connected to the first wiring structure 140 in the first semiconductor element layer 120. The first lower connection pad 142 may be electrically connected to the first through-electrode 130 through the first wiring structure 140. The first lower connection pad 142 may include at least one selected from aluminum (Al), copper (Cu), nickel (Ni), tungsten (W), platinum (Pt), and gold (Au).

A first upper connection pad 144 electrically connected to the first through-electrode 130 may be formed on the upper surface of the first semiconductor substrate 110. In some embodiments, the first upper connection pad 144 may be made of the same material as the first lower connection pad 142. Although not shown, an upper passivation layer may be formed on the upper surface of the first semiconductor substrate 110 to partially surround the side surfaces of the first through-electrode 130.

A first connection bump 170 may be placed to contact the first lower connection pad 142. The first connection bump 170 may electrically connect the first semiconductor chip 100 to the base substrate 500. The first connection bump 170 may be connected to receive, and may receive at least one of a control signal, a power signal, and a ground signal for operating the first to fourth semiconductor chips 100 to 400 from outside of the semiconductor package 1000. The first connection bumps 170 may be provided with data signals that include to be stored in the first to fourth semiconductor chips 100 to 400 from the outside of the semiconductor package 100. The first connection bumps 170 may provide data stored in the first to fourth semiconductor chips 100 to 400 to the outside. The first connection bumps 170 may be made up of a pillar structure, a ball structure or a solder layer, as examples.

The second semiconductor chip 200 may include a second semiconductor substrate 210, a second semiconductor element layer 220 having a second wiring structure 240, a second through-electrode 230, a second lower connection pad 242, a second upper connection pad 244, and a second connection bump 270.

The second semiconductor chip 200 may be placed on the first semiconductor chip 100. The second semiconductor chip 200 may be electrically connected to the first semiconductor chip 100 through the second connection bump 270 placed between the first semiconductor chip 100 and the second semiconductor chip 200.

A second fillet layer 160 may be placed between the upper surface of the first semiconductor chip 100 and the lower surface of the second semiconductor chip 200. The second fillet layer 160 may attach the second semiconductor chip 200 onto the first semiconductor chip 100. The second fillet layer 160 may surround the first upper connection pads 144, the second connection bumps 270 and the second lower connection pads 242 placed between the first semiconductor chip 100 and the second semiconductor chip 200.

The second fillet layer 160 may protrude outward from the side surfaces of the first semiconductor chip 100 and the second semiconductor chip 200. The second fillet layer 160 protruding outward from the side surfaces of the first semiconductor chip 100 and the second semiconductor chip 200 may cover a part of the side surfaces of the first semiconductor chip 100 and the second semiconductor chip 200. For example, the second fillet layer 160 protruding outward from the side surfaces of the first semiconductor chip 100 and the second semiconductor chip 200 may cover bottom portions of the side surfaces of the second semiconductor chip 200 and top portions of the side surfaces of the first semiconductor chip 100. A part of a side surface of the first semiconductor chip, and a part of a side surface of the second semiconductor chip 200 may not be covered by a fillet layer. A side surface 160S of the second fillet layer 160 that protrudes outward from the side surfaces of the first semiconductor chip 100 and the second semiconductor chip 200 may form a curved surface.

The third semiconductor chip 300 may be placed on the second semiconductor chip 200. The third semiconductor chip 300 may include a third semiconductor substrate 310, a third semiconductor element layer 320 having a third wiring structure 340, a third through-electrode 330, a third lower connection pad 342, a third upper connection pad 344 and a third connection bump 370.

The fourth semiconductor chip 400 may be placed on the third semiconductor chip 300. The fourth semiconductor chip 400 may include a fourth semiconductor substrate 410, a fourth semiconductor element layer 420 having a fourth wiring structure 440, a fourth lower connection pad 442, and a fourth connection bump 470. Unlike the first to third semiconductor chips 100 to 300, the fourth semiconductor chip 400 may not include a through-electrode or an upper connection pad.

A second fillet layer 160 may be placed between the upper surface of the second semiconductor chip 200 and the lower surface of the third semiconductor chip 300. The second fillet layer 160 may surround the second upper connection pads 244, the third connection bump 370 and the third lower connection pad 342 placed between the second semiconductor chip 200 and the third semiconductor chip 300.

A second fillet layer 160 may be placed between the upper surface of the third semiconductor chip 300 and the lower surface of the fourth semiconductor chip 400. The second fillet layer 160 may surround the third upper connection pads 344, the fourth connection bump 470, and the fourth lower connection pad 442 placed between the third semiconductor chip 300 and the fourth semiconductor chip 400.

The second to fourth semiconductor chips 200 to 400 may be substantially the same as or similar to the first semiconductor chip 100. Therefore, detailed description of the second to fourth semiconductor chips 200 to 400 will not be provided.

The base substrate 500 may be, for example, a printed circuit board (PCB), a ceramic substrate or an interposer. Alternatively, the base substrate 500 may be a semiconductor chip including semiconductor elements. The base substrate 500 may function as a support substrate of the semiconductor package. For example, the aforementioned first to fourth semiconductor chips 100 to 400 may be stacked on the base substrate 500.

The base substrate 500 may include a substrate body 510, a lower pad 520 and an upper pad 530. The lower pad 520 may be placed on the lower surface of the substrate body 510. The upper pad 530 may be placed on the lower surface of the substrate body 510. External connection terminals 40 may be placed under the base substrate 500. The external connection terminals 40 may be placed on the lower surface pad 520. For example, the external connection terminals 40 may be solder balls or bumps.

A first fillet layer 150 may be formed between the base substrate 500 and the first semiconductor chip 100. The first fillet layer 150 may surround the first connection bumps 170 and the first lower connection pads 142, between the base substrate 500 and the first semiconductor chip 100.

The first fillet layer 150 may protrude outward from the side surface of the first semiconductor chip 100. The first fillet layer 150 protruding outward from the side surface of the first semiconductor chip 100 may cover a part of the side surface of the first semiconductor chip 100. A side surface 150S of the first fillet layer 150 protruding outward from the side surface of the first semiconductor chip 100 may form a curved surface.

A dam structure 600 may be placed on the base substrate 500. The dam structure 600 may be placed vertically between the base substrate 500 and the first semiconductor chip 100. The dam structure 600 may be placed under the first semiconductor chip 100. In some embodiments, the dam structure 600 does not contact the first semiconductor chip 100. For example, the upper surface of the dam structure 600 and the lower surface of the first semiconductor chip 100 may be spaced apart from each other.

The dam structure 600 may be placed on the base substrate 500 to overlap the first to fourth corners CR1 to CR4 of the first semiconductor chip 100. The dam structure 600 may be placed at intersections of the first to fourth side surfaces SS1 to SS4 of the first semiconductor chip 100. Referring to FIG. 4, in a plan view, the dam structure 600 may extend along a part of the first side surfaces SS1 to SS4 of the first semiconductor chip 100.

In a plan view, the dam structure 600 may include pieces having an "L" shape. The dam structure 600 may have a shape bent by 90 degrees at the first to fourth corners CR1 to CR4 of the first semiconductor chip 100.

The dam structure 600 may overlap the first semiconductor chip 100. Specifically, the dam structure 600 may overlap the first semiconductor chip 100 in the third direction Z perpendicular to the base substrate 500. An outer surface 600ESW of the dam structure 600 (e.g., an outer side surface facing away from a center of the first semiconductor chip 100) may be placed on the same plane as the side surface of the first semiconductor chip 100.

The dam structure 600 may include pieces that have a first width W1, second width W2, third width W3, and fourth width W4 in the first direction X. The first width W1 and second width W2 each refer to a width of a thinner portion of each piece in a first direction (e.g., the first direction X), and the third width W3 and fourth width W4 each refer to a width of a thicker portion of each piece in the same first direction (e.g., the first direction X). Though the first width W1 and second width W2 are shown to be the same, the embodiments are not limited as such, and the first width W1 can be different from the second width W2. Similarly, though the third width W3 and fourth width W4 are shown to be the same, the embodiments are not limited as such, and the third width W3 can be different from the fourth width W4. The base substrate 500 may have a substrate width W510 in the first direction X. The dam structure 600 may include, for example four pieces, one beneath each corner of the first semiconductor chip 100. Each piece of the dam structure may also be described as a dam structure 600, or may be described as dam, or dam structure portion. The dam structure 600 may include a plurality of dams overlapping respective corners of the first semiconductor chip 100 from a plan view, and may include spaces, or gaps, between the dams along side surfaces of the first semiconductor chip 100. The sum of the first width W1 and the second width W2, or the sum of the third width W3 and the fourth width W4 may be 10% to 20% of the substrate width W510. For example, from a particular cross-sectional view as depicted in FIG. 5 or plan view as depicted in FIG. 4, the total length of the dam structure 600 in the first direction X (e.g., the sum of the third width W3 and fourth width W4) may be 10% to 20% of the width of the base substrate 500. As mentioned above, each piece of the dam structure 600 (e.g., each dam) may have an "L" shape in one embodiment, where the outside sides of the "L" (e.g., the sides that vertically overlap a side surface of the first semiconductor chip 100) have the widths W3 or W4 and part of each "L" shape extending in the second direction Y has the widths W1 and W2.

The first fillet layer 150 may cover the dam structure 600 (e.g., it may cover and contact top and side surfaces of the different pieces of the dam structure 600). The first fillet layer 150 may be placed between (e.g., vertically between) the dam structure 600 and the first semiconductor chip 100. The first fillet layer 150 may protrude outward from the outer surface 600ESW of the dam structure 600. It will be understood that when an element is referred to as being "connected" or "coupled" to or "on" another element, or as "covering" another element, it can be directly connected or coupled to or on the other element or covering the other element, or intervening elements may be present. In contrast, when an element is referred to as being "directly connected" or "directly coupled" to another element, or as "contacting" or "in contact with" another element (or using any form of the word "contact"), there are no intervening elements present at the point of contact. Other words used to describe the relationship between elements should be interpreted in a like fashion (e.g., "between" versus "directly between," "adjacent" versus "directly" adjacent," etc.).

The thickness of the first fillet layer 150 in the third direction Z between the dam structure 600 and the first semiconductor chip 100 (e.g., that vertically overlaps the dam structure 600) may be smaller than the thickness of the first fillet layer 150 in the third direction Z between the base substrate 500 and the first semiconductor chip 100 (e.g., where the first fillet layer 150 does not overlap the dam structure 600).

A side surface 150S of the first fillet layer 150 may protrude outward from the outer surface 600ESW of the dam structure 600. The side surface 150S of the first fillet layer 150 may protrude outward from the side surface of the first semiconductor chip 100. The side surface 150S of the first fillet layer 150 may further protrude beyond the side surface 160S of the second fillet layer 160. For example, in one embodiment, the maximum width of the first fillet layer 150 in the first direction X or the second direction Y may be greater than the maximum width of the second fillet layer 160 in the corresponding direction. The first fillet layer 150 may have a curved side surface, as viewed in a cross section, such as from the second direction Y, and/or may have a curved side surface, as viewed from a plan view, such as from the third direction Z, as shown in FIGS. 4 and 5. The second fillet layer 160 may have a curved side surface, as viewed in a cross section, such as from the second direction Y, and/or may have a curved side surface, as viewed from a plan view, such as from the third direction Z, as also shown in FIGS. 4 and 5. Thus, the first fillet layer 150 and second fillet layer 160 may each have convex surfaces that bulge away from a center of the semiconductor package 1000. Also, in some embodiments, the different fillet layers (e.g., the first fillet layer 150 and second fillet layers 160) do not touch each other, so that there is a gap between each fillet layer.

A molding member 700 may be formed on the base substrate 500. The molding member 700 may cover the first fillet layer 150, the second fillet layer 160, and the first to fourth semiconductor chips 100 to 400. The molding member 700 may include or be formed of, for example a polymer, such as a resin. For example, the molding member 700 may include or may be, but is not limited to, EMC (Epoxy Molding Compound).

The molding member 700 may not be placed between the base substrate 500 and the first semiconductor chip 100. Specifically, since the first fillet layer 150 is filled between the base substrate 500 and the first semiconductor chip 100, the molding member 700, and in some embodiments the material that forms the molding member 700, is not placed between the base substrate 500 and the first semiconductor chip 100. The molding member 700 may be described as an encapsulant, or a mold layer.

Figure 6:
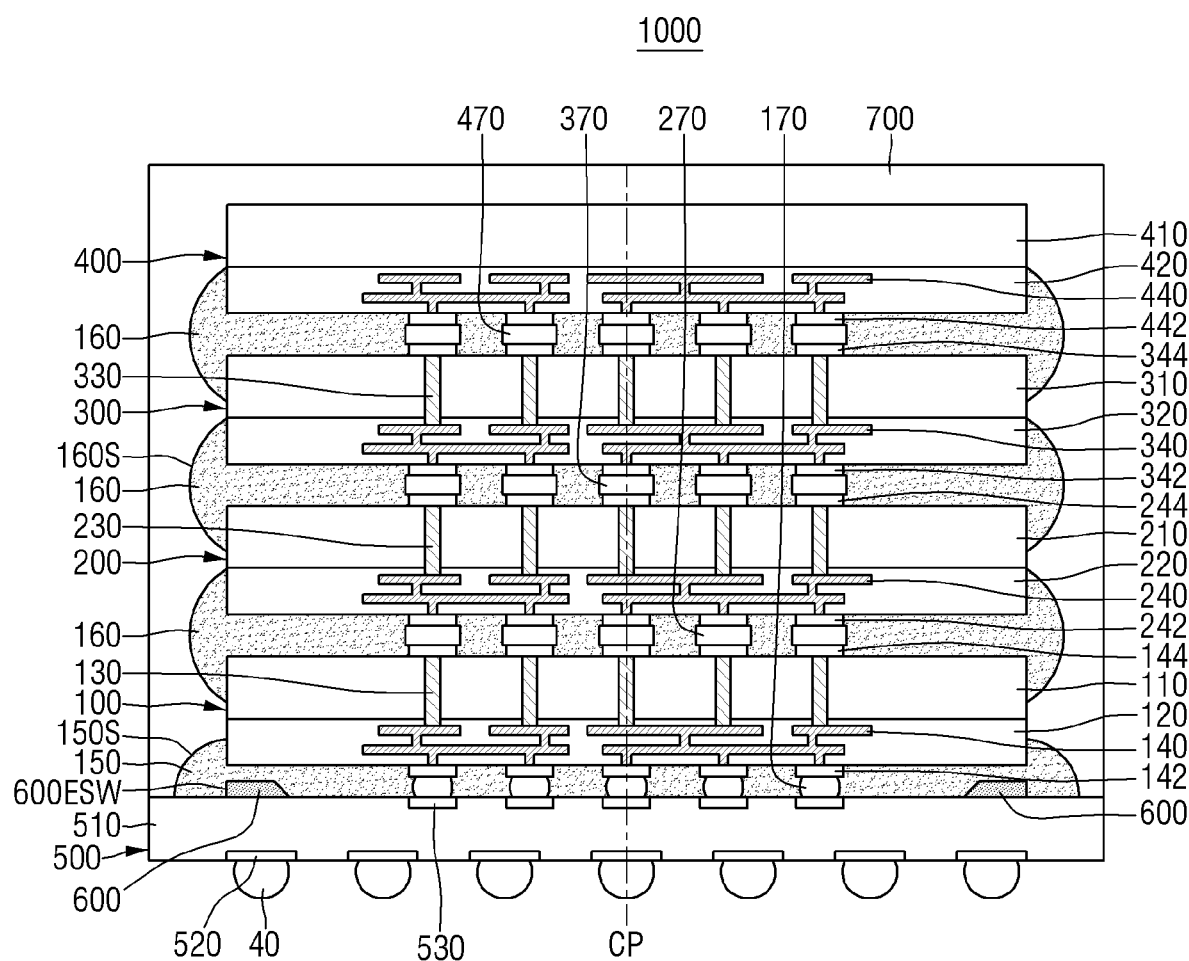
FIGS. 6 to 8 are cross-sectional views for explaining a semiconductor package according to some other embodiments.
Figure 7:
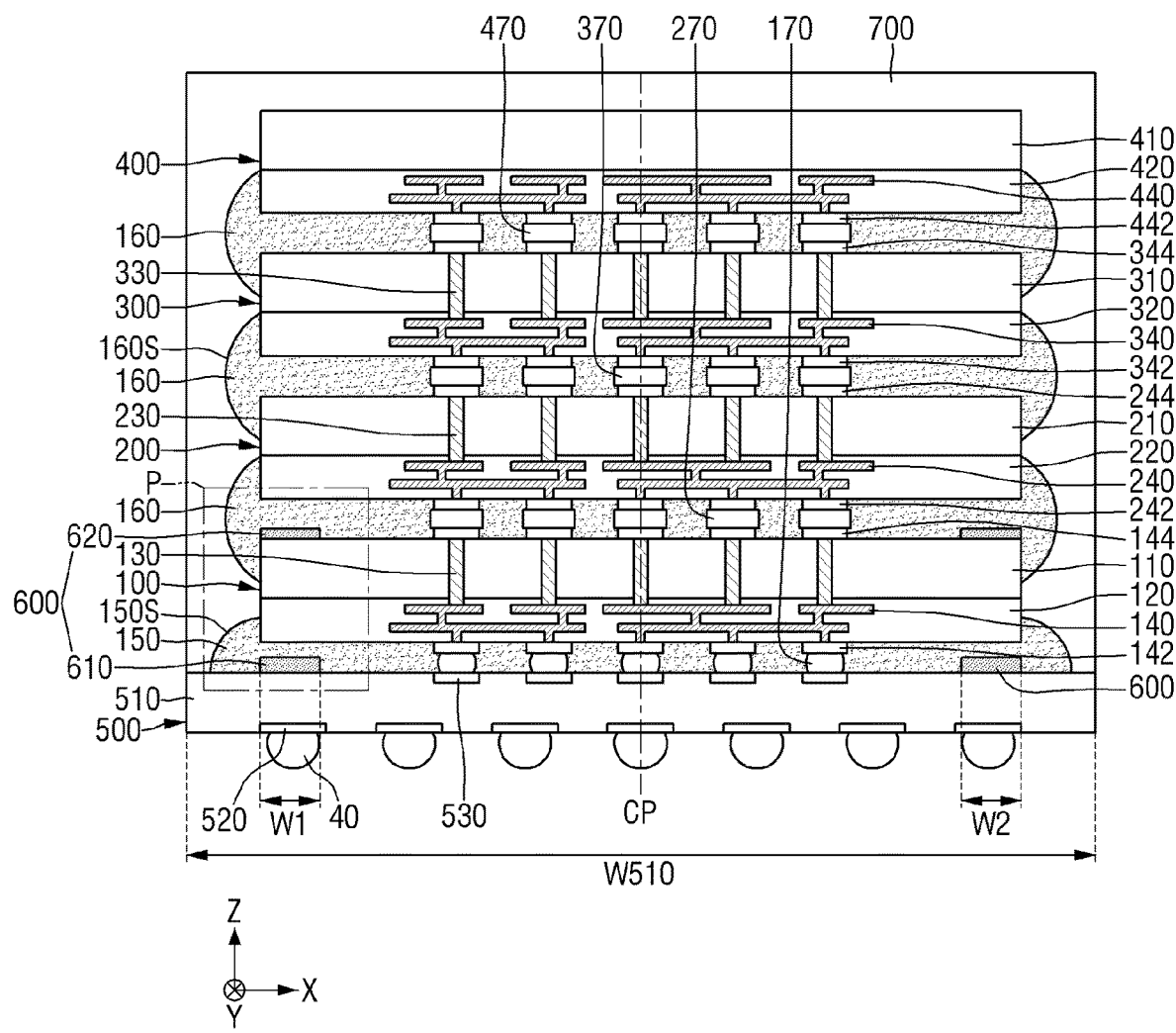
Figure 8:
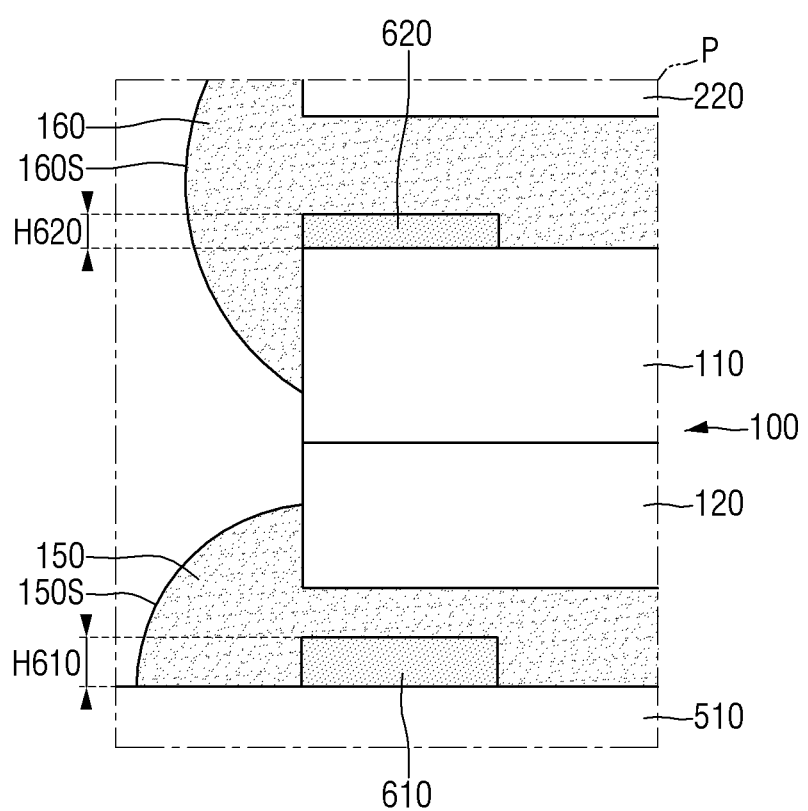

FIGS. 6 to 8 are cross-sectional views for explaining a semiconductor package according to some other embodiments. For reference, FIG. 8 is an enlarged view showing a portion P of FIG. 7. For convenience of explanation, the description will focus on points that are different from those described with reference to FIGS. 1 to 5.

Referring to FIGS. 4 and 6, the height of the dam structure 600 may not be constant. In the third direction Z, the height of the dam structure 600 may decrease toward the center CP of the first to fourth semiconductor chips 100 to 400. For example, the height of the dam structure 600 at a first point nearer to the center CP of the first to fourth semiconductor chips 100 to 400 may be smaller than the height of the dam structure 600 at a second point further spaced apart from the center CP of the first to fourth semiconductor chips 100 to 400. The dam structure 600 may therefore have a slanted side surface at an inner side surface (or at both inner side surfaces for an "L" shape).

Referring to FIGS. 7 and 8, the dam structure 600 may include a first dam structure 610 and a second dam structure 620.

The first dam structure 610 may be placed on the base substrate 500. The first dam structure 610 may be placed between the base substrate 500 and the first semiconductor chip 100. An outer surface of the first dam structure 610 may be placed on the same plane as the side surface of the first semiconductor chip 100.

The second dam structure 620 may be placed on the first semiconductor chip 100. The second dam structure 620 may be placed between the first semiconductor chip 100 and the second semiconductor chip 200. The second dam structure 620 may not be in contact with the second semiconductor chip 200. The outer surface of the second dam structure 620 may be placed on the same plane as the side surface of the second semiconductor chip 200.

The first dam structure 610 may have a first height H610 in the third direction Z. The second dam structure 620 may have a second height H620 in the third direction Z. In one embodiment, the second height H620 may be smaller than the first height H610. The first dam structure 610 and the second dam structure 620, from a plan view, may have the same shape as the dam structure 600 of FIGS. 4 and 5. Alternatively, other embodiments described below may have a similar structure in terms of thickness and having two sets of dam structures as shown in FIG. 7, but may have the shapes described in the embodiments below.

The first fillet layer 150 may cover the first dam structure 610. The first fillet layer 150 may protrude outward from the outer surface of the first dam structure 610. A second fillet layer 160 may cover the second dam structure 620. The second fillet layer 160 may protrude outward from the outer surface of the second dam structure 620. The side surface 150S of the first fillet layer 150 may further protrude outward beyond the side surface 160S of the second fillet layer 160 with respect to the center CP of the first to fourth semiconductor chips 100 to 400.

Although both the first dam structure 610 and the second dam structure 620 may have the same widths in the first width W1 through fourth width W4 in FIGS. 7 and 8 (examples of W3 and W4 can be seen in FIGS. 4 and 5), the embodiments are not limited thereto. For example, the first dam structure 610 and the second dam structure 620 may each have different widths from each other.

Figure 11:
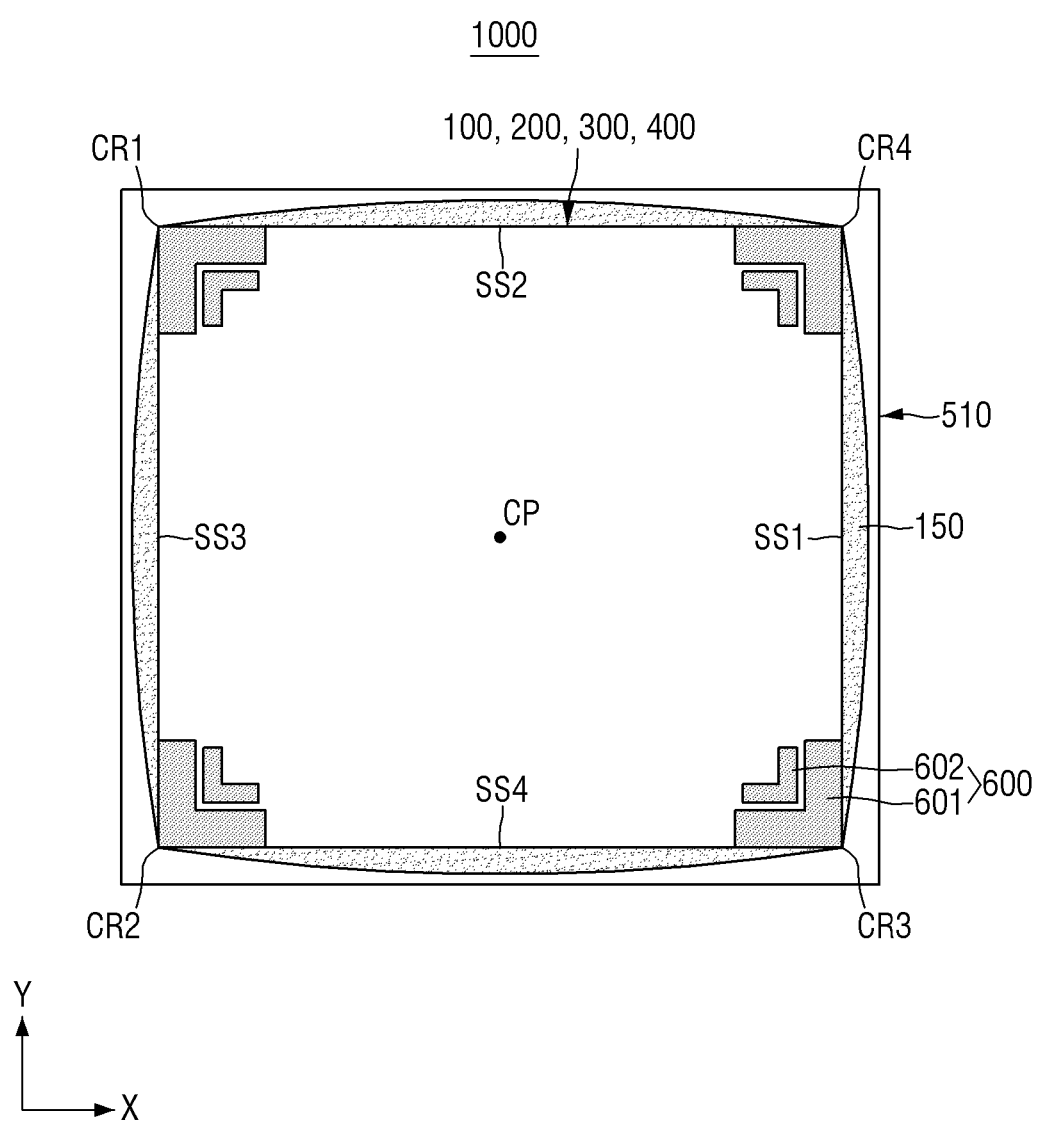
Figure 12:
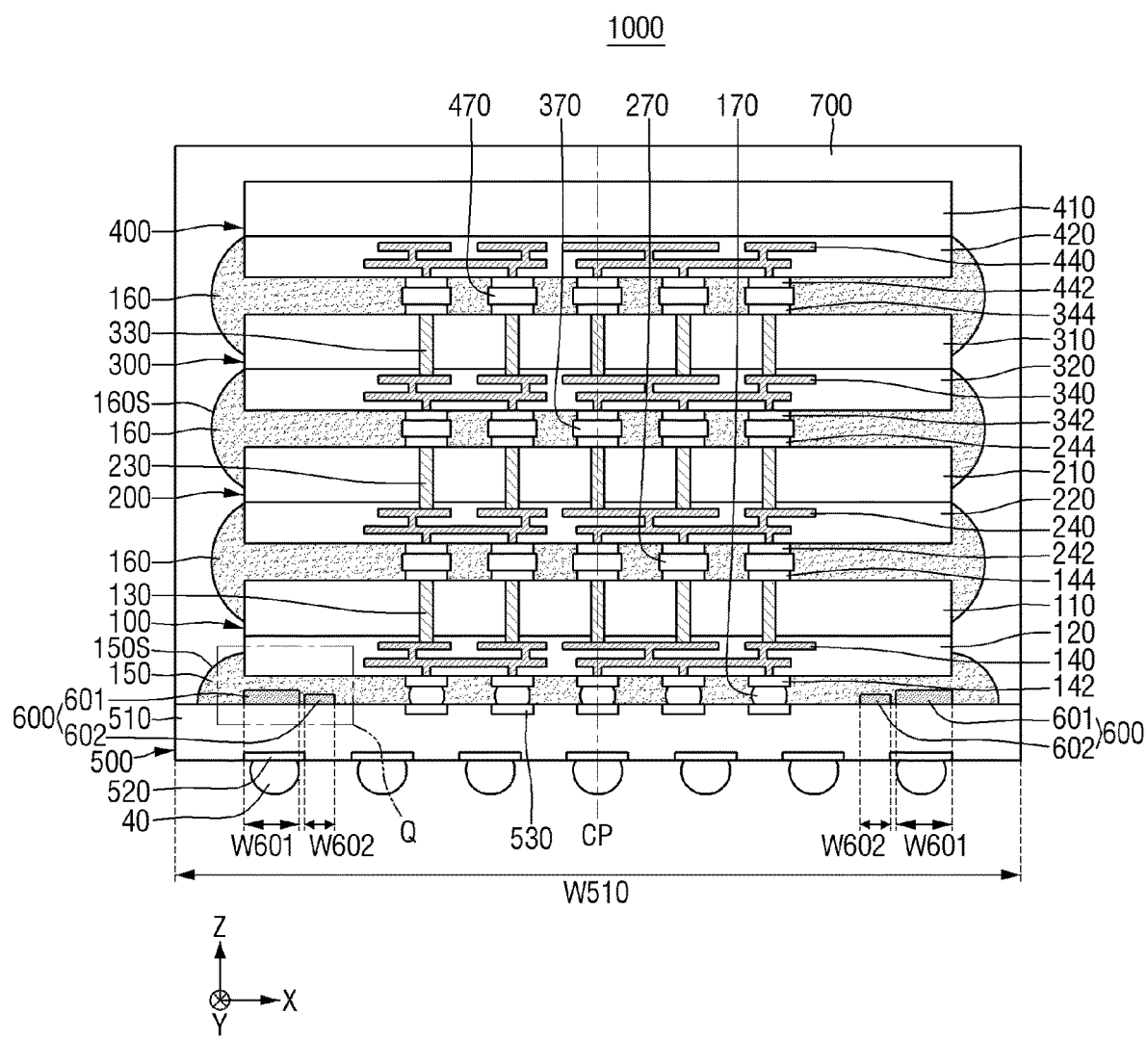
Figure 13:
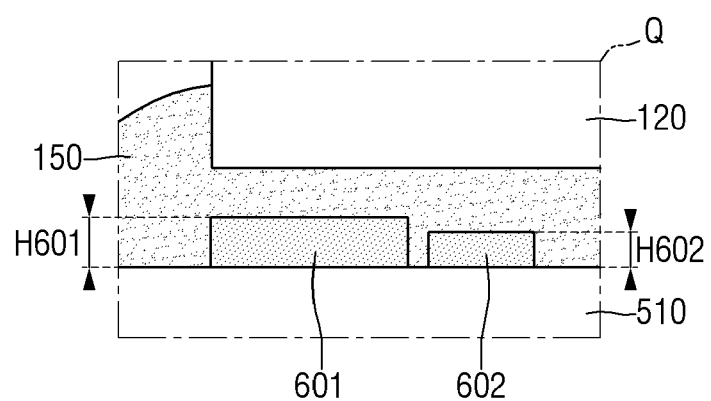

FIGS. 9 to 15 are diagrams for explaining a semiconductor package according to some other embodiments. For reference, FIG. 13 is an enlarged view showing a portion Q of FIG. 12. For convenience of explanation, the explanation will focus on points that are different from those explained with reference to FIGS. 1 to 8.

Figure 9:
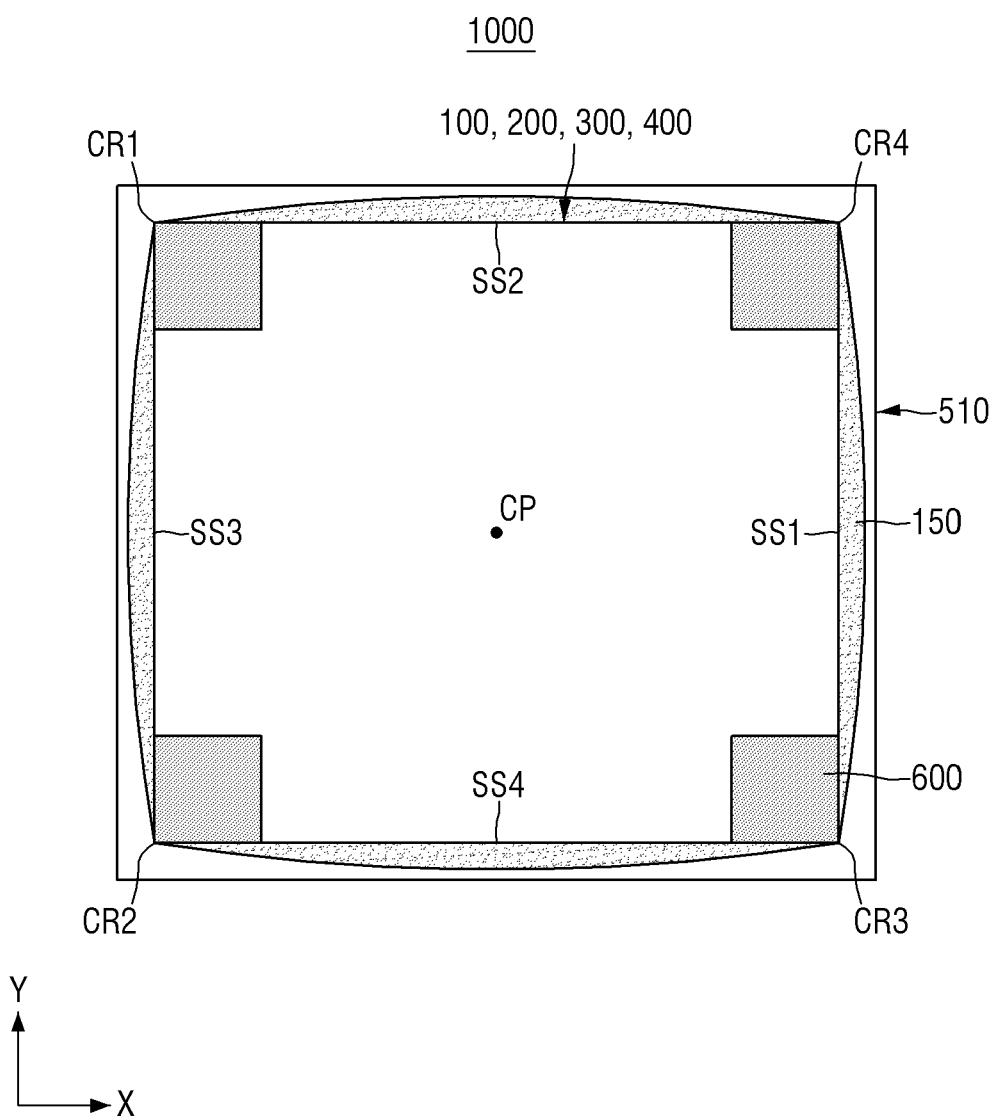
FIGS. 9 to 15 are diagrams for explaining a semiconductor package according to some other embodiments.

Referring to FIG. 9, the dam structure 600 may have a rectangular shape. A rectangular dam structure 600 may overlap each of the first to fourth corners CR1 to CR4 of the first to fourth semiconductor chips 100 to 400.

Figure 10:
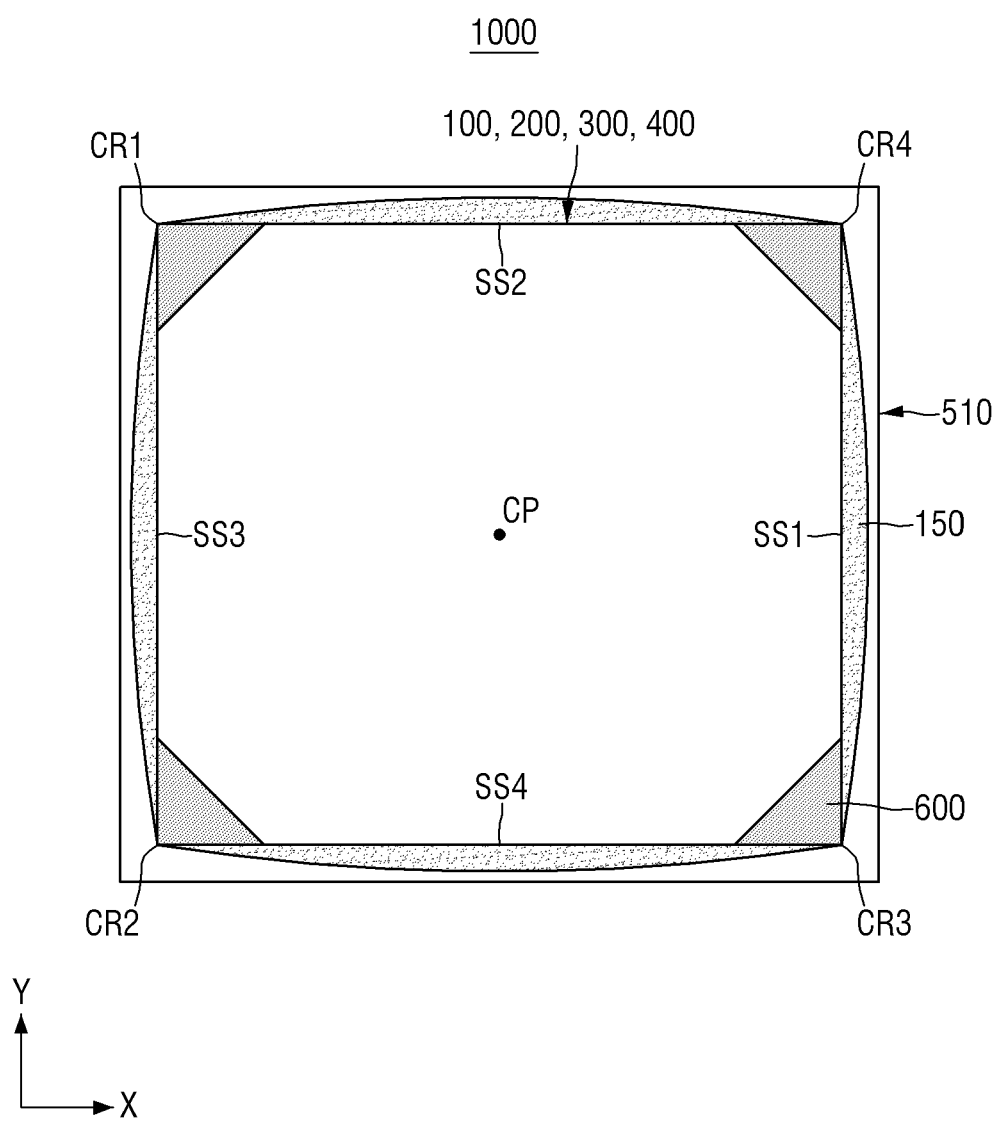

Referring to FIG. 10, the dam structure 600 may have a triangular shape. Each triangular dam structure 600 may overlap one of the first to fourth corners CR1 to CR4 of the first to fourth semiconductor chips 100 to 400. Specifically, triangular two sides of the dam structure 600 in the layout diagram may extend along a part of the side surfaces SS1 to SS4 of the first to fourth semiconductor chips 100 to 400. The same width relationship may apply to the dam structures in FIGS. 9 and 10 as in the embodiments of FIGS. 4-8, such that the maximum width of the combined dam structures in a first direction X may be 10% to 20% of the width of the substrate 510.

Referring to FIGS. 11 to 13, the dam structure 600 (e.g., each dam) may include a first sub-dam 601 and a second sub-dam 602. With reference to the center CP of the first to fourth semiconductor chips 100 to 400, the second sub-dam 602 may be placed nearer to the center CP than the first sub-dam 601. The first sub-dam 601 may be placed outside the second sub-dam 602 with respect to the center CP.

The first sub-dam 601 and the second sub-dam 602 may be placed under the first semiconductor chip 100. The first sub-dam 601 and the second sub-dam 602 may completely overlap the first semiconductor chip 100. The first sub-dam 601 may overlap the first to fourth corners CR1 to CR4 of the first to fourth semiconductor chips 100 to 400. The first sub-dam 601 may surround the outer surface of the second sub-dam 602.

The first sub-dam 601 and the second sub-dam 602 may have the same shape. Specifically, the first sub-dam 601 and the second sub-dam 602 may be bent into the same shape in the layout diagram.

The first sub-dam 601 may have a first sub-height H601. The second sub-dam 602 may have a second sub-height H602. The first sub-height H601 may be greater than the second sub-height H602. Therefore, the thickness of the first fillet layer 150 placed between the first semiconductor chip 100 and the base substrate 500 may be smaller on the first sub-dam 601 than on the second sub-dam 602. That is, the thickness of the first fillet layer 150 placed between the first sub-dam 601 and the first semiconductor chip 100 may be smaller than the thickness of the first fillet layer 150 placed between the second sub-dam 602 and the first semiconductor chip 100.

The first sub-dam 601 may have a first width W601 (e.g., for the part of each "L" shape extending in the second direction Y) and the second sub-dam 602 may have a second width W602 (e.g., for the part of each "L" shape extending in the second direction Y) that is smaller than the first width W601.

The first fillet layer 150 may further protrude outward from the first sub-dam 601 with respect to the center CP of the first to fourth semiconductor chips 100 to 400.

Figure 14:
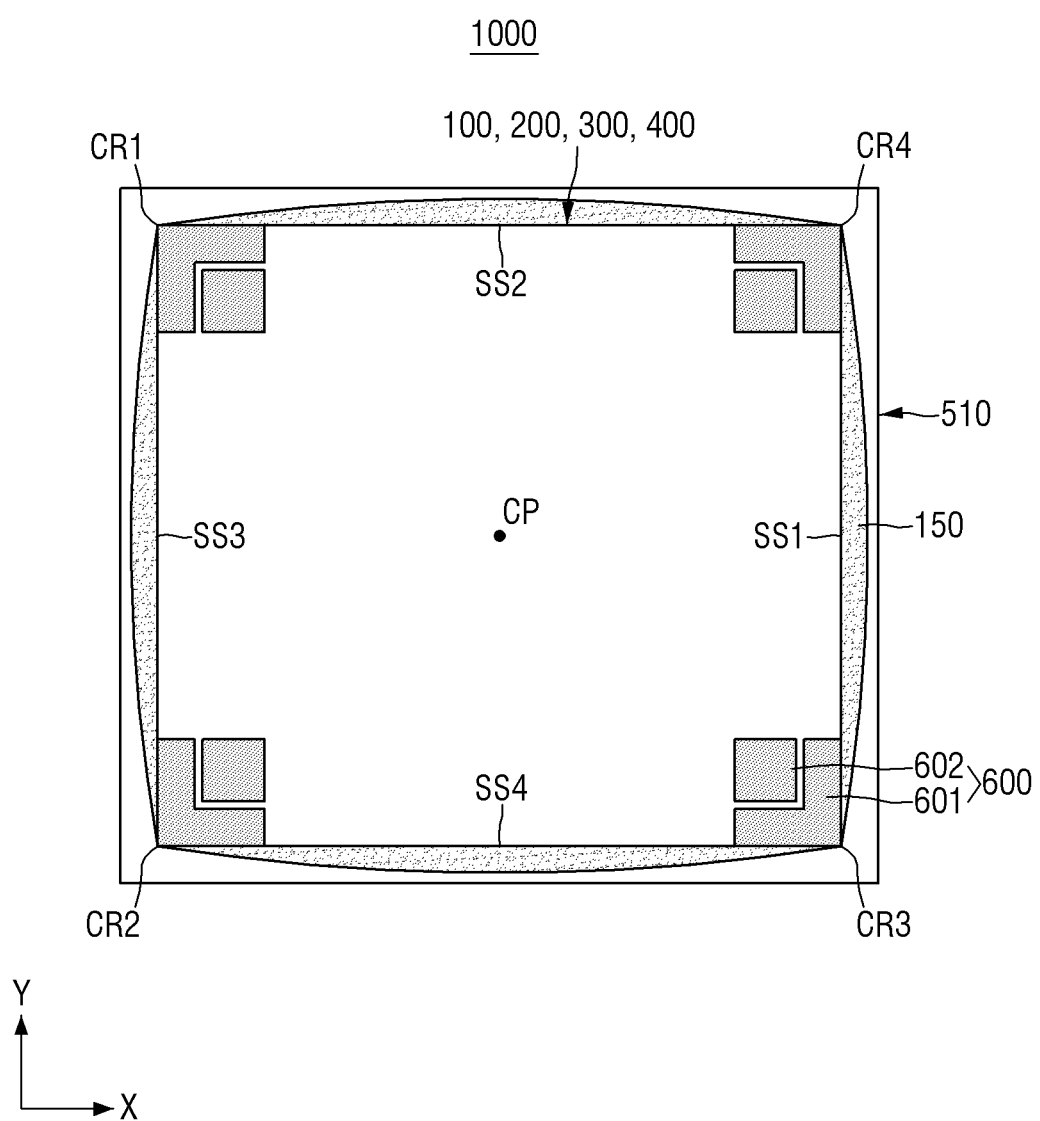

Referring to FIG. 14, the first sub-dam 601 and the second sub-dam 602 may have different shapes. Specifically, the first sub-dam 601 may have an "L" shape that is bent at first to fourth corners CR1 to CR4. The second sub-dam 602 may have a rectangular shape. The first sub-dam 601 may be placed outside the second sub-dam 602 with respect to the center CP of the first to fourth semiconductor chips 100 to 400. The first sub-dam 601 may surround the outer surface of the second sub-dam 602.

Figure 15:
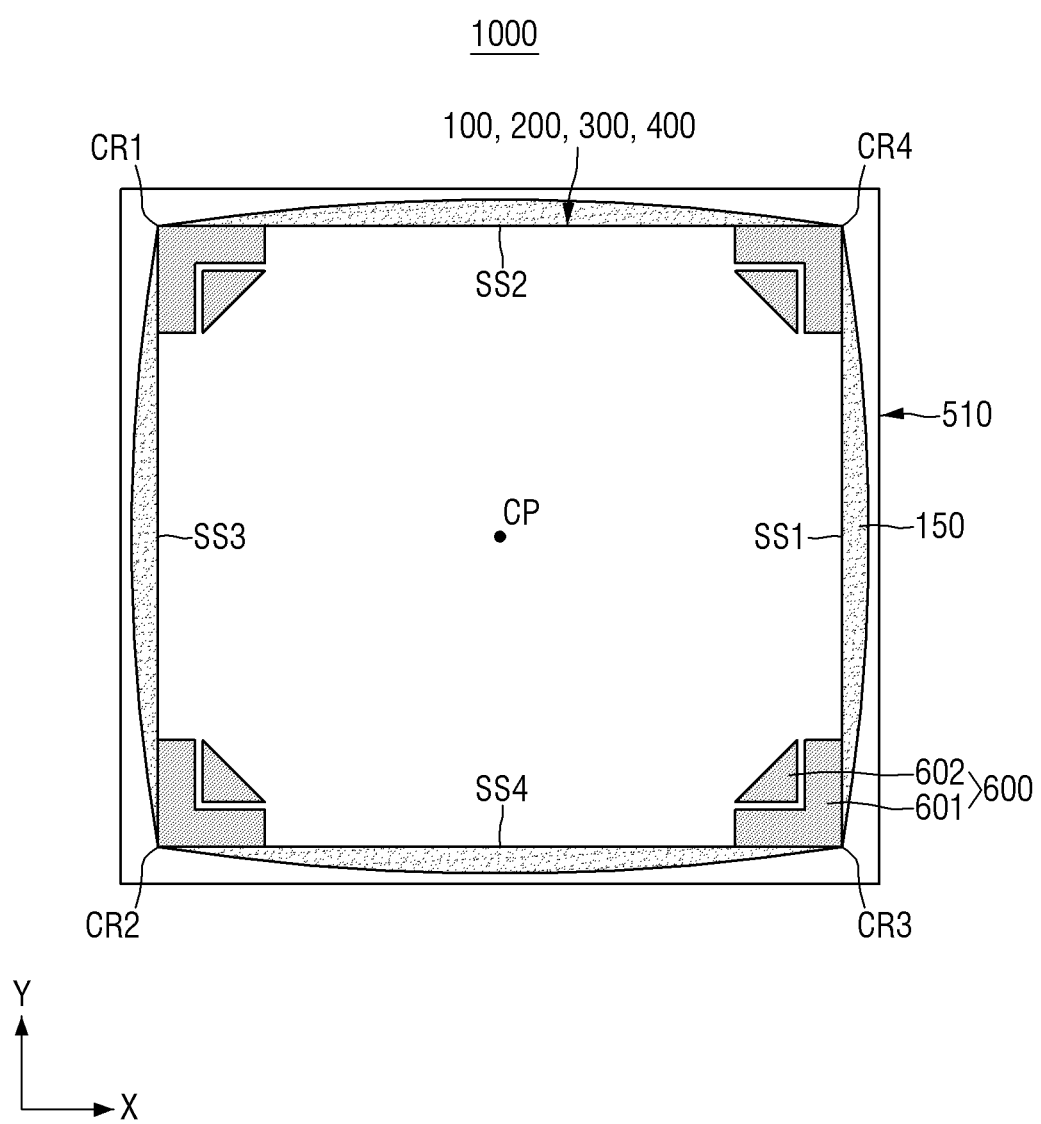

Referring to FIG. 15, the first sub-dam 601 may have a curved "L" shape at the first to fourth corners CR1 to CR4. The second sub-dam 602 may have a triangular shape. The first sub-dam 601 may surround the outer surface of the second sub-dam 602.

Although FIGS. 4 to 15 show various shapes of the dam structure 600, the embodiments are not limited thereto. The dam structure 600 may have a deformed shape other than the shape shown in the drawings.

FIGS. 16 to 20 are diagrams for explaining intermediate steps of fabricating a semiconductor package according to some embodiments.

Figure 16:
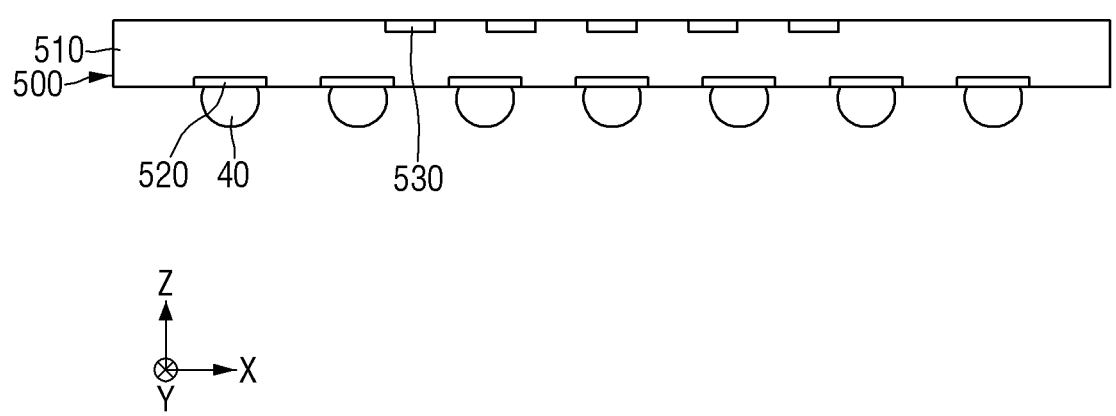
FIGS. 16 to 20 are diagrams for explaining intermediate steps of fabricating a semiconductor package according to some embodiments.

Referring to FIG. 16, a base substrate 500 may be provided.

Specifically, the base substrate 500 may be formed in which the lower surface pads 520, the upper surface pads 530 and the external connection terminals 40 are formed on the substrate body 510.

Figure 17:
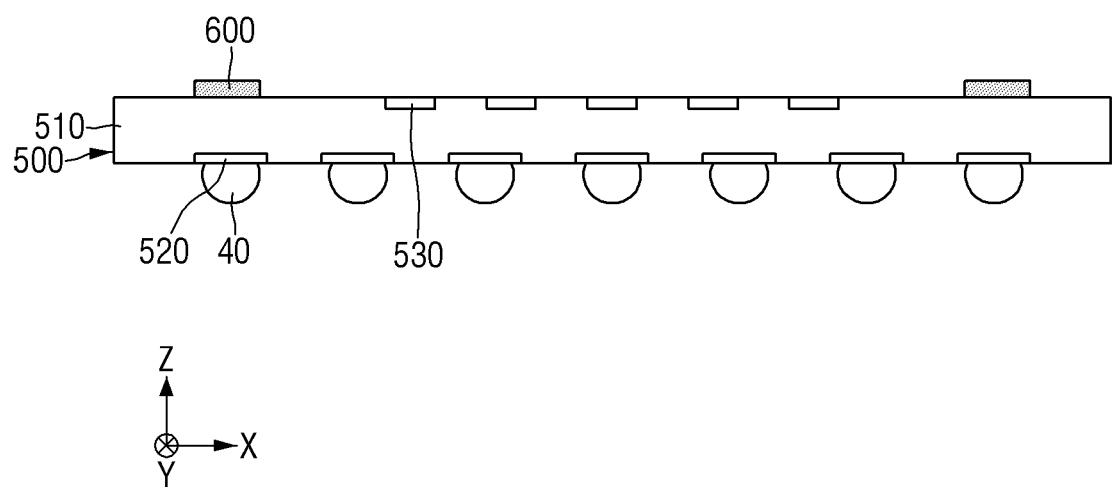

Referring to FIG. 17, the dam structure 600 may be provided on the base substrate 500.

The dam structure 600 may include or be formed of an insulating material such as a photoresist material, for example. A position of the dam structure 600 may be set in consideration of the size and position of semiconductor chips to be formed on the base substrate 500 later. The dam structure 600 may be formed on the base substrate 500 to overlap the corner of the first semiconductor chip 100 that will be formed later.

Figure 18:
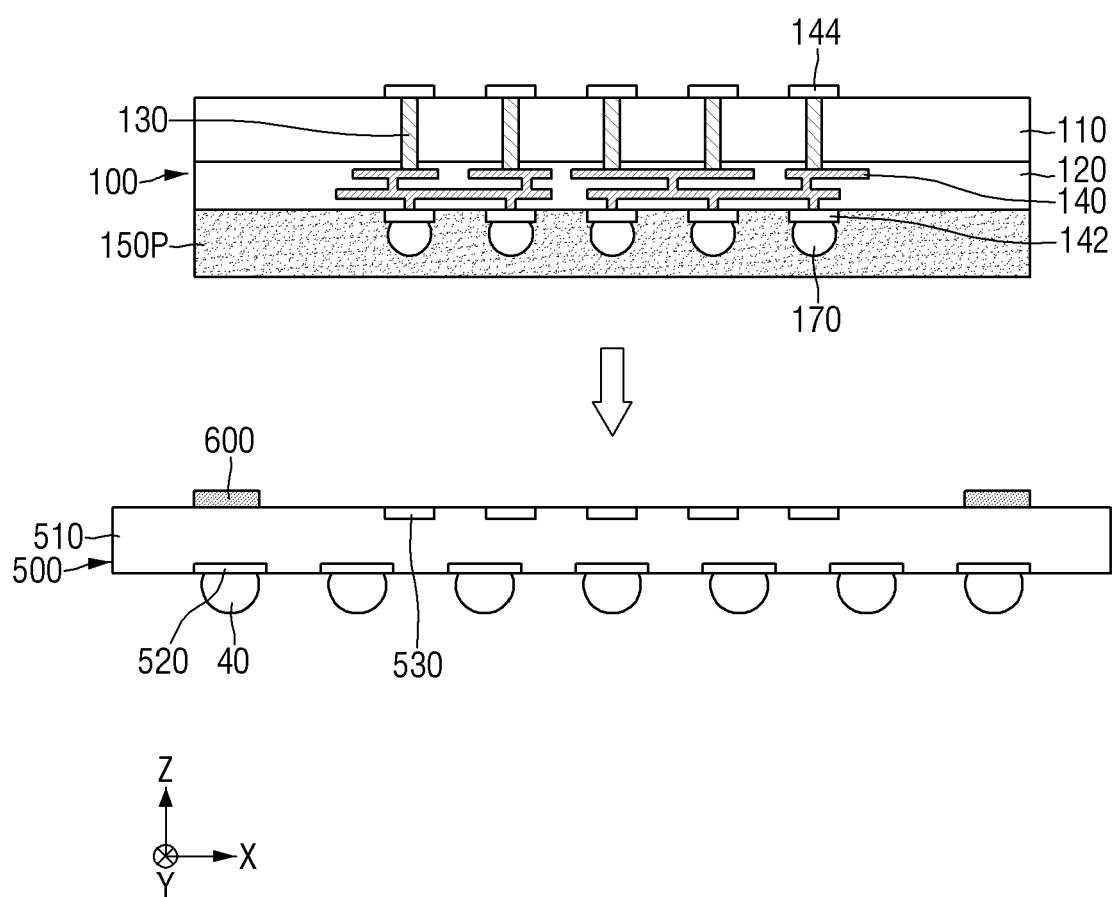

Referring to FIG. 18, a pre-fillet layer 150P is formed under the first semiconductor chip 100.

Specifically, the pre-fillet layer 150P may be formed on the first semiconductor chip 100 to cover the first lower connection pads 142 and the first connection bumps 170 formed under the first semiconductor chip 100. The pre-fillet layer 150P may include a non-conductive film. For example, the non-conductive film may be formed of or may include materials such as an adhesive resin. The adhesive resin may be a thermosetting resin. The adhesive resin may include, for example, at least one material selected from a bisphenol-type epoxy resin, a novolak-type epoxy resin, a phenol resin, a urea resin, a melamine resin, an unsaturated polyester resin, and a resorcinol resin.

Figure 19:
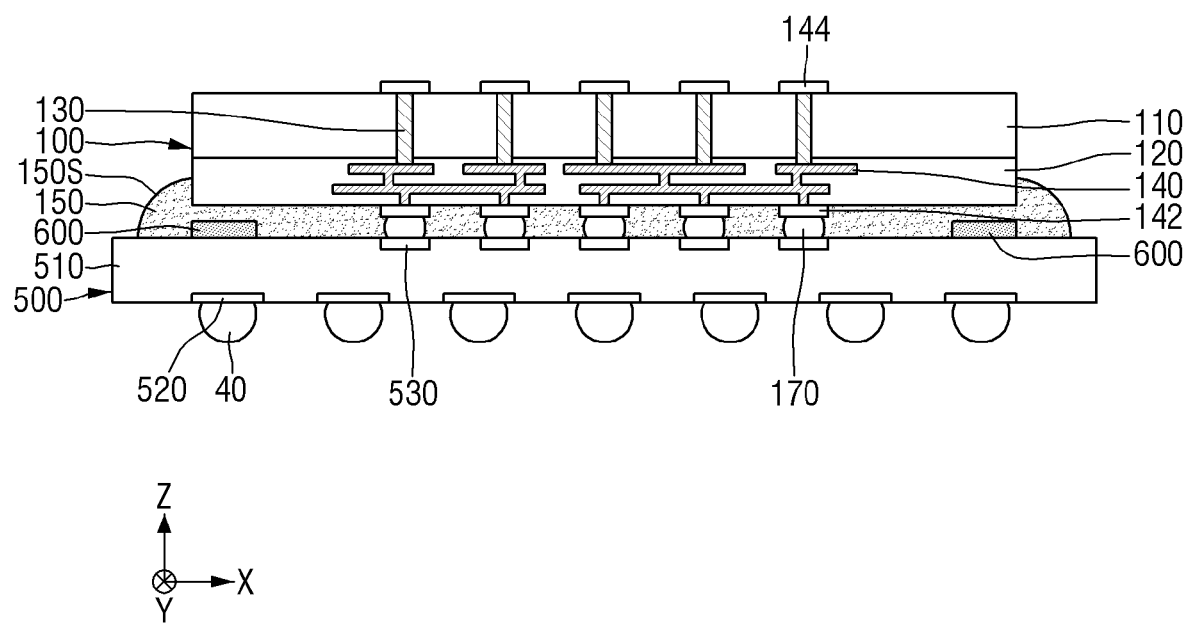

Next, referring to FIGS. 18 and 19, the pre-fillet layer 150P and the first semiconductor chip 100 are attached onto the base substrate 500.

Specifically, the first fillet layer 150 may be formed by pressing the first semiconductor chip 100 formed with the pre-fillet layer 150P on the base substrate 500. The first fillet layer 150 may be filled between the dam structure 600 and the first semiconductor chip 100. The first fillet layer 150 may protrude outward from the side surface of the first semiconductor chip 100.

Since the dam structure 600 is placed at a position that overlaps the corner of the first semiconductor chip 100 and space between the different corner dams is left open, the first fillet layer 150 can spread more widely when pressed, and need not be pressed with as much pressure. As a result, a separated space between the base substrate 500 and the first semiconductor chip 100 decreases, and warpage can be reduced. Therefore, even if the first semiconductor chip 100 formed with the pre-fillet layer 150P is not excessively pressed on the base substrate 500, the first fillet layer 150 may be filled between the base substrate 500 and the first semiconductor chip 100, including at the corners of the first semiconductor chip 100 due to displacement by the dam structure 600. This improves upon conventional devices, which either include no dam or include a dam that entirely surrounds the semiconductor chips and is disposed outside of the semiconductor chips on a substrate.

The first connection bumps 170 may be connected to the upper pads 530. For example, the first connection bumps 170 may be compressed in the third direction Z, and may then be heated to form a stronger connection. The first fillet layer 150 may be attached onto the base substrate 500. The first fillet layer 150 may be filled between the base substrate 500 and the first semiconductor chip 100.

Figure 20:
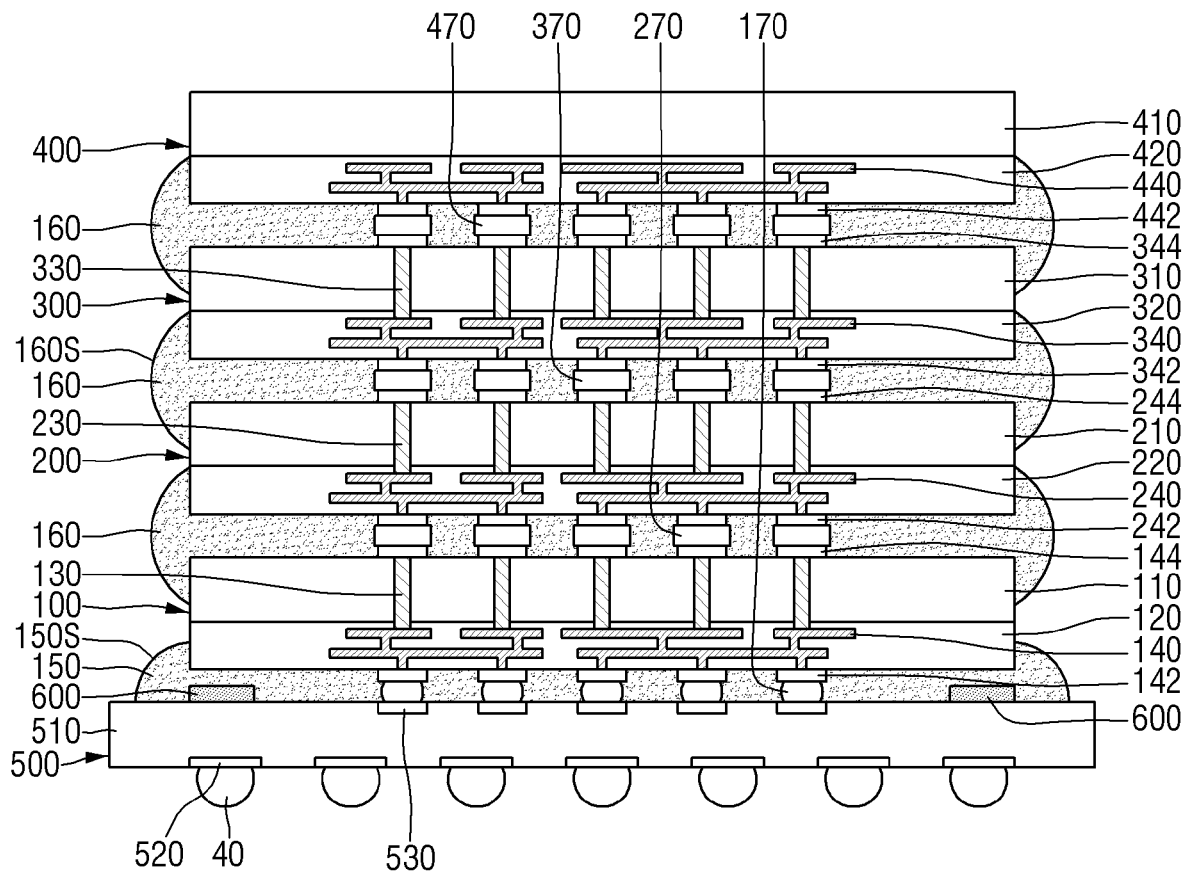

Referring to FIG. 20, a pre-fillet layer may be formed under the second semiconductor chip 200 and pressed on the first semiconductor chip 100, as in FIGS. 18 and 19. The pre-fillet layer may be formed under the third semiconductor chip 300 and pressed on the second semiconductor chip 200. The pre-fillet layer may be formed under the fourth semiconductor chip 400 and pressed on the third semiconductor chip 300. Again, to improve the strengthen the physical and electrical connection between each pair of semiconductor chips and between the first semiconductor chip 100 and the base substrate 500, the device may be heated at this time. Alternatively, the device may be heated after each additional chip is placed in the stack, or may be heated only one time after the entire stack is formed.

Next, referring to FIG. 5, a molding member 700 is formed to cover the first fillet layer 150, the second fillet layer 160, and the first to fourth semiconductor chips 100 to 400.

In concluding the detailed description, those skilled in the art will appreciate that many variations and modifications may be made to the preferred embodiments without substantially departing from the principles of the present invention. Therefore, the disclosed preferred embodiments of the invention are used in a generic and descriptive sense only and not for purposes of limitation.

What is claimed is:

1. A semiconductor package comprising:
   a base substrate;
   a first semiconductor chip on the base substrate;
   a first dam structure which overlaps a corner of the first semiconductor chip from a plan view, and is placed on the base substrate; and
   a first fillet layer which is placed vertically between the base substrate and the first semiconductor chip, and vertically between the first dam structure and the first semiconductor chip.

2. The semiconductor package of claim 1, wherein the first fillet layer includes a non-conductive film.

3. The semiconductor package of claim 1, further comprising:
   a molding member which covers the base substrate, the first semiconductor chip, and the first fillet layer,
   wherein the molding member is not placed between the base substrate and the first semiconductor chip.

4. The semiconductor package of claim 1, wherein the first fillet layer protrudes outward beyond a side surface of the first semiconductor chip.

5. The semiconductor package of claim 1, wherein the first dam structure includes a plurality of dams, and a combined width of the dams of the first dam structure, from a cross-sectional view, is 10% to 20% of a width of the base substrate from the cross-sectional view.

6. The semiconductor package of claim 1, wherein:
   the first dam structure includes a first sub-dam and a second sub-dam,
   the first sub-dam is nearer to a center of the first semiconductor chip than the second sub-dam, and
   a height of the first sub-dam is less than a height of the second sub-dam.

7. The semiconductor package of claim 1, further comprising:
   a second semiconductor chip on the first semiconductor chip;
   a second fillet layer placed between the first semiconductor chip and the second semiconductor chip; and
   a molding member which covers the base substrate, the first semiconductor chip, the first fillet layer, the second semiconductor chip, and the second fillet layer.

8. The semiconductor package of claim 7, further comprising:
   a second dam structure which overlaps the corner of the second semiconductor chip and is placed on the first semiconductor chip,
   wherein a height of the second dam structure is less than the height of the first dam structure.

9. The semiconductor package of claim 7, wherein the first fillet layer protrudes outward from a side surface of the first semiconductor chip beyond the second fillet layer.

10. The semiconductor package of claim 7, further comprising:
a connection pad and a connection bump which are placed in the second fillet layer between the first semiconductor chip and the second semiconductor chip, and electrically connect the first semiconductor chip and the second semiconductor chip.

11. The semiconductor package of claim 1, wherein the first dam structure does not contact the first semiconductor chip.

12. The semiconductor package of claim 1, wherein the first dam structure includes a plurality of dams overlapping respective corners of the first semiconductor chip from the plan view, and includes spaces between the dams along side surfaces of the first semiconductor chip.

13. A semiconductor package comprising:
a base substrate;
a first semiconductor chip on the base substrate;
a first dam structure which overlaps a corner of the first semiconductor chip and is placed on the base substrate; and
a first filling layer formed of a non-conductive material, placed vertically between the base substrate and the first semiconductor chip, and vertically between the first dam structure and the first semiconductor chip,
wherein the first filling layer protrudes outward from an outer surface of the first dam structure and from a side surface of the first semiconductor chip.

14. The semiconductor package of claim 13, wherein the outer surface of the first dam structure is on the same plane as the side surface of the first semiconductor chip.

15. The semiconductor package of claim 13, wherein the first dam structure includes a plurality of dams, and a combined width of the dams of the first dam structure, from a cross-sectional view, is 10% to 20% of a width of the base substrate from the cross-sectional view.

16. The semiconductor package of claim 13, wherein the first dam structure does not contact the first semiconductor chip.

17. The semiconductor package of claim 13, further comprising:
a second semiconductor chip on the first semiconductor chip;
a second filling layer placed between the first semiconductor chip and the second semiconductor chip; and
a second dam structure which vertically overlaps a corner of the second semiconductor chip and is placed on the first semiconductor chip between the first semiconductor chip and the second semiconductor chip.

18. A semiconductor package comprising:
a base substrate;
a first semiconductor chip on the base substrate;
a first dam, which vertically overlaps a first corner of the first semiconductor chip, is disposed on the base substrate, and does not contact the first semiconductor chip;
a first filling layer disposed vertically between the base substrate and the first semiconductor chip, and vertically between the first dam and the first semiconductor chip;
a second semiconductor chip on the first semiconductor chip;
a second filling layer filled vertically between the first semiconductor chip and the second semiconductor chip; and
a molding member which covers the base substrate, the first semiconductor chip, the first filling layer, and the second semiconductor chip,
wherein the molding member is not disposed between the base substrate and the first semiconductor chip.

19. The semiconductor package of claim 18, further comprising:
at least a second dam, which vertically overlaps a second corner of the first semiconductor chip, is disposed on the base substrate at the same vertical level as the first dam, and does not contact the first semiconductor chip,
wherein the first filling layer protrudes beyond a side surface of the first semiconductor chip, a side surface of the first dam, and a side surface of the second dam in a space between the first dam and the second dam.

20. The semiconductor package of claim 18, further comprising:
a second dam that overlaps a corner of the second semiconductor chip, is placed on the first semiconductor chip, and does not contact the second semiconductor chip,
wherein the first dam is vertically between the base substrate and the first semiconductor chip, and the second dam is vertically between the first semiconductor chip and the second semiconductor chip, and
wherein a height of the second dam is less than a height of the first dam.

* * * * *